United States Patent
Okada et al.

(10) Patent No.: US 9,188,624 B2
(45) Date of Patent: Nov. 17, 2015

(54) INSPECTION APPARATUS

(71) Applicants: Akira Okada, Tokyo (JP); Hajime Akiyama, Tokyo (JP); Kinya Yamashita, Tokyo (JP)

(72) Inventors: Akira Okada, Tokyo (JP); Hajime Akiyama, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 281 days.

(21) Appl. No.: 13/741,195

(22) Filed: Jan. 14, 2013

(65) Prior Publication Data

US 2013/0285684 A1    Oct. 31, 2013

(30) Foreign Application Priority Data

Apr. 26, 2012  (JP) .................................. 2012-101421

(51) Int. Cl.
| | | |
|---|---|---|
| *G01R 31/02* | (2006.01) | |
| *G01R 31/26* | (2014.01) | |
| *G01R 31/28* | (2006.01) | |

(52) U.S. Cl.
CPC ........ *G01R 31/2601* (2013.01); *G01R 31/2642* (2013.01); *G01R 31/2875* (2013.01)

(58) Field of Classification Search
CPC ....................................................... H01L 22/00
USPC ........................................ 324/754.01–758.01
See application file for complete search history.

(56) References Cited

U.S. PATENT DOCUMENTS

| | | | |
|---|---|---|---|
| 5,666,064 A | 9/1997 | Kasai et al. | |
| 2005/0253614 A1 | 11/2005 | Maruyama et al. | |
| 2006/0012368 A1* | 1/2006 | Volke et al. | 324/318 |
| 2007/0257675 A1* | 11/2007 | Marek et al. | 324/318 |

FOREIGN PATENT DOCUMENTS

| | | |
|---|---|---|
| EP | 1091400 A1 | 4/2001 |
| JP | 553-018971 A | 2/1978 |
| JP | H02-192749 A | 7/1990 |
| JP | 03-158764 A | 7/1991 |
| JP | H04-077674 A | 3/1992 |
| JP | H06-349909 A | 12/1994 |
| JP | H10-056045 A | 2/1998 |
| JP | 2000-138268 A | 5/2000 |
| JP | 2001-033484 A | 2/2001 |
| JP | 2002-022768 A | 1/2002 |
| JP | 2004-227842 A | 8/2004 |
| JP | 2005-164537 A | 6/2005 |
| JP | 2005-326222 A | 11/2005 |
| JP | 2006-108456 A | 4/2006 |
| JP | 2008-103528 A | 5/2008 |

(Continued)

OTHER PUBLICATIONS

The first Office Action issued by the Chinese Patent Office on Nov. 4, 2014, which corresponds to Chinese Patent Application No. 201310093674.6 and is related to U.S. Appl. No. 13/741,195; with English language partial translation.

(Continued)

*Primary Examiner* — Vincent Q Nguyen
(74) *Attorney, Agent, or Firm* — Studebaker & Brackett PC

(57) ABSTRACT

An inspection apparatus includes a probe substrate, a socket secured to the probe substrate, a heating element wire wound around the socket, a probe tip detachably connected to the socket, a stage on which an object to be measured is mounted, and a heating unit for heating the stage.

15 Claims, 6 Drawing Sheets

(56) References Cited

FOREIGN PATENT DOCUMENTS

| JP | 2008-304274 | A | | 12/2008 |
|---|---|---|---|---|
| JP | 2010-169417 | A | | 8/2010 |
| JP | 2010169417 | A | * | 8/2010 |
| JP | 2011-007671 | A | | 1/2011 |
| JP | 2012-021223 | A | | 2/2012 |
| WO | 2004/065940 | A1 | | 8/2004 |

OTHER PUBLICATIONS

An Office Action; "Notification of Reason for Rejection," issued by the Japanese Patent Office on Jan. 20, 2015, which corresponds to Japanese Patent Application No. 2012-101421 and is related to U.S. Appl. No. 13/741,195; with English language partial translation.

An Office Action; "Notification of Reason for Rejection," issued by the Japanese Patent Office on Jun. 23, 2015, which corresponds to Japanese Patent Application No. 2012-101421 and is related to U.S. Appl. No. 13/741,195; with English language partial translation.

An Office Action; "Decision of Final Rejection," issued by the Japanese Patent Office on Sep. 1, 2015, which corresponds to Japanese Patent Application No. 2012-101421 and is related to U.S. Appl. No. 13/741,195; with English language partial translation.

The second Office Action issued by the Chinese Patent Office on Jul. 22, 2015, which corresponds to Chinese Patent Application No. 201310093674.6 and is related to U.S. Appl. No. 13/741,195; with English language partial translation.

* cited by examiner

INSPECTION APPARATUS

BACKGROUND OF THE INVENTION

1. Field of the Invention

The present invention relates to an inspection apparatus used to measure electrical characteristics, etc. of a semiconductor device.

2. Background Art

Japanese Laid-Open Patent Publication No. H03-158764 discloses a probe configured such that the temperature of its tip can be adjusted. This probe is assembled by stacking a plurality of substrates, such as those with a heating element wire or Peltier device mounted thereon.

Japanese Laid-Open Patent Publication No. 2000-138268 discloses a technique for heating a probe substrate with a probe connected thereto using radiant heat from a heating element wire. Thus this technique indirectly heats the probe by heating the probe substrate.

It is known practice to measure electrical characteristics of a semiconductor device in a heated or cooled state. If a probe at room temperature is brought into contact with the semiconductor device in a heated or cooled state, a change in the temperature of the semiconductor device occurs, resulting in reduced inspection accuracy. This temperature change is significant in cases where many probes are brought into contact with the semiconductor device, or the surface of contact between the probe and the semiconductor device is large.

Further, if a high current is caused to flow through the probe when there is a large difference in temperature between the semiconductor device and the probe, the surface of the semiconductor device in contact with the probe is rapidly heated up, so that the surface is subjected to a significant thermal history. It has been found in some cases that this thermal history degrades the characteristics of the semiconductor device.

Therefore, it is preferable to substantially equalize the temperatures of the semiconductor device and the probe. In order to achieve this, the probes disclosed in the above publications are configured such that their temperature can be varied. However, the probe disclosed in the Publication No. H03-158764 is complicated in structure and costly, since it is formed by stacking a plurality of substrates. Further, considerable work is required to replace a probe having a complicated structure.

In the case of the probe disclosed in the above Publication No. 2000-138268, it is difficult to accurately control the temperature of the probe, since the probe is indirectly heated by heating the probe substrate. Further, high power, long duration heating is required to heat up the probe substrate, meaning that heating of the probe substrate is not effective in heating up the probe. Furthermore, the heat resistance of the probe substrate is not high enough to allow the temperature of the substrate to be increased to higher than 150-200° C. As such, it has been found in some cases that the probe cannot be heated to the desired temperature.

SUMMARY OF THE INVENTION

The present invention has been made to solve the foregoing problems. It is, therefore, an object of the present invention to provide an inspection apparatus which can vary the temperature of its probe directly using a simple structure.

The features and advantages of the present invention may be summarized as follows.

According to one aspect of the present invention, an inspection apparatus includes a probe substrate, a socket secured to the probe substrate, a heating element wire wound around the socket, a probe tip detachably connected to the socket, a stage on which an object to be measured is mounted, and a heating unit for heating the stage.

According to another aspect of the present invention, an inspection apparatus includes a probe substrate, a probe connected to the probe substrate, a heater for heating the probe by directly illuminating the probe with infrared radiation, a stage on which an object to be measured is mounted, and a heating unit for heating the stage.

Other and further objects, features and advantages of the invention will appear more fully from the following description.

DETAILED DESCRIPTION OF THE PREFERRED EMBODIMENTS

First Embodiment

Figure 1:
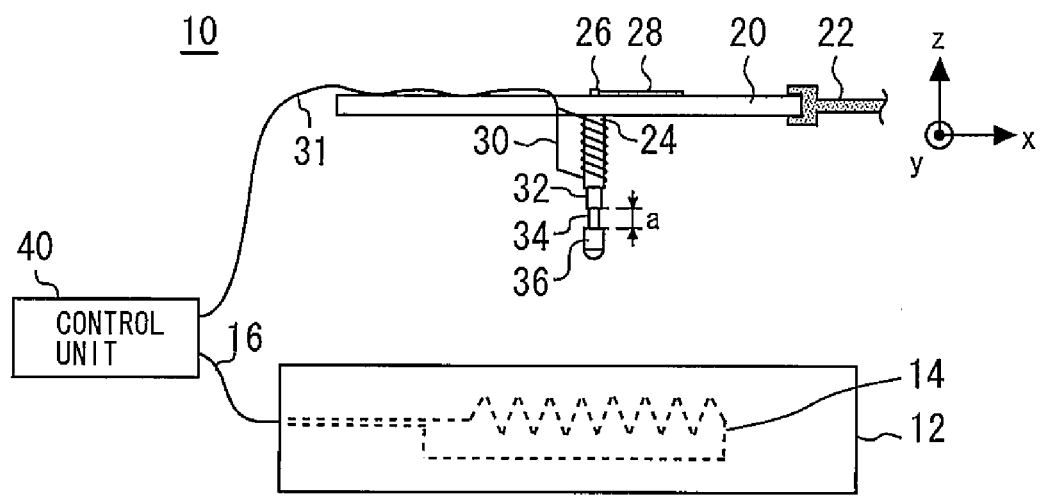
FIG. 1 is a front view of an inspection apparatus in accordance with a first embodiment of the present invention.

FIG. 1 is a front view of an inspection apparatus in accordance with a first embodiment of the present invention. The inspection apparatus 10 has a stage 12 on which a semiconductor device (an object to be measured) is mounted. The stage 12 has formed therein a heating unit 14 for heating the stage 12. The heating unit 14 is formed of a heating element wire, and is indicated by dashed line in FIG. 1. This heating unit 14 receives a supply of current from an insulated cable 16.

The inspection apparatus 10 has a probe substrate 20. The probe substrate 20 is held by an arm 22 and can be moved in the desired direction. A socket 24 is secured to the probe substrate 20. A connection member 26 which is electrically connected to the socket 24 is exposed at the surface of the probe substrate 20. The connection member 26 is connected to a signal line 28 on the surface of the probe substrate 20.

A heating element wire 30 is wound around the socket 24. The heating element wire 30 is connected to an insulated cable 31. A plug 32 is detachably connected to the socket 24. The plug 32 is, e.g., screwed or press-fit at one end into the socket 24. An extensible member 34 is secured at one end to the other end of the plug 32. The extensible member 34 has a spring therein which allows the member to extend in its longitudinal direction. That is, it is possible to vary the length of the extensible member 34 projecting from the plug 32, which length is indicated by letter a in FIG. 1.

A probe tip 36 is secured to the other end of the extensible member 34. The leading edge of the probe tip 36 is rounded. The probe tip 36 is secured to the socket 24 by the extensible member 34 and the plug 32. The probe tip 36 is electrically connected to the connection member 26.

The socket 24, the plug 32, the extensible member 34, and the probe tip 36 together form a so-called probe. The components of this probe is formed of conductive material. For example, they are formed of metal material such as copper, tungsten, or rhenium tungsten. The probe tip 36 is preferably coated with, e.g., gold, palladium, tantalum, or platinum, etc. in order to enhance its conductivity and durability.

Figure 2:
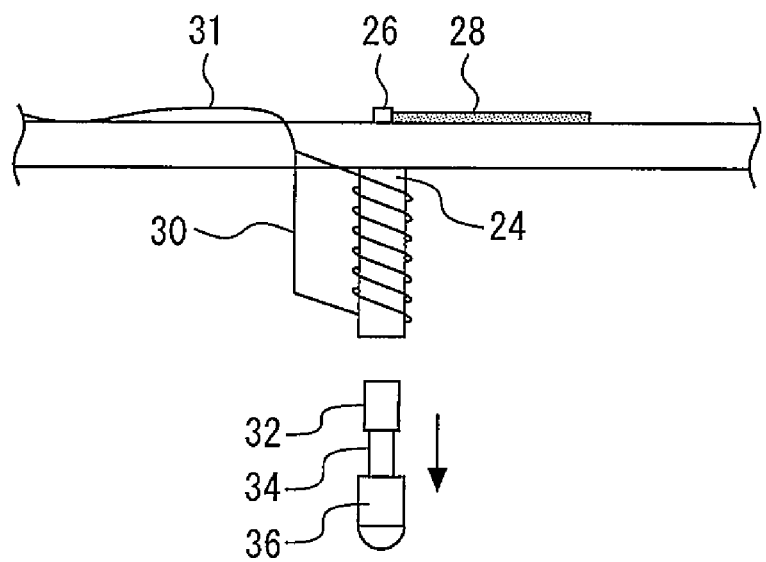
FIG. 2 is a front view showing the way in which the probe tip is attached to and detached from the socket.

FIG. 2 is a front view showing the way in which the probe tip is attached to and detached from the socket. Since the plug 32 is detachably connected to the socket 24, the probe tip 36 (which is connected to the plug 32) can be attached to and detached from the socket 24 by attaching the plug 32 to and detaching it from the socket 24.

Referring back to FIG. 1, the cables 16 and 31 are connected to a control unit 40. The control unit 40 is designed to control the amounts of heat generated from the heating element wire 30 and the heating unit 14 so as to equalize the temperatures of the probe tip 36 and the stage 12.

The operation of the inspection apparatus 10 of the first embodiment will now be described. First, a semiconductor device (an object to be measured) is mounted on the stage 12. The semiconductor device has a pad for contact with the probe. Next, the temperatures of the heating element wire 30 and the heating unit 14 are increased under the control of the control unit 40 so as to substantially equalize the temperatures of the probe tip 36 and the stage 12. This makes it possible to substantially equalize the temperatures of the probe tip 36 and the semiconductor device.

The probe tip 36 is then brought into contact with the pad of the semiconductor device by means of the arm 22. At that time, the extensible member 34 extends or retracts so that the probe tip 36 is pressed against the pad with appropriate pressure. In this state, electrical characteristics of the semiconductor device are measured.

In the semiconductor device of the first embodiment, since the probe is directly heated by the heating element wire 30, the temperature of the probe can be accurately controlled (or varied in the desired manner). This control allows the temperatures of the probe tip 36 and the semiconductor device to be substantially equalized, resulting in increased inspection accuracy. Further, it is possible to prevent the semiconductor device from being subjected to a significant thermal history and thereby increase the yield of semiconductor devices.

The inspection apparatus 10 of the first embodiment heats the probe using a simple construction, namely, the socket 24 wound with the heating element wire 30, making it possible to manufacture the inspection apparatus 10 at low cost. Further, when the probe tip 36 has worn out due to repeated use for inspection, it can be easily replaced merely by detaching the plug 32 from the socket 24. Furthermore, the socket 24 and the heating element wire 30 can be reused after replacing the probe tip 36.

Further, measurement of electrical characteristics of the semiconductor device can be initiated immediately after the probe tip 36 has been brought into contact with the semiconductor device, since their temperatures are substantially equalized beforehand. Therefore, in this case the overall measurement operation takes a shorter time than in the case in which the probe tip is brought into contact with the semiconductor device when they are at different temperatures, since in the latter case it is not possible to initiate the measurement of electrical characteristics of the semiconductor device until the temperatures of the probe and the semiconductor device have become substantially equal.

Figure 3:
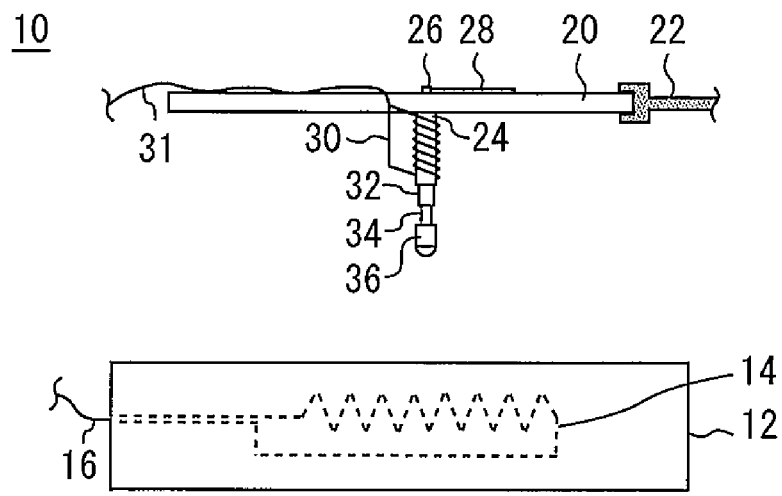
FIG. 3 is a front view of a variation of the inspection apparatus of the first embodiment.

FIG. 3 is a front view of a variation of the inspection apparatus of the first embodiment. This inspection apparatus is not provided with a control unit, and the heating element wire 30 and the heating unit 14 are separately controlled. For example, when inspecting a semiconductor device after heating the stage 12 to 120° C., a current is caused to flow through the heating element wire 30 so as to also heat the probe tip 36 to 120° C. The temperatures of the probe tip and the stage can be more accurately equalized by use of a control unit. However, there may be no need for such a control unit in applications which do not require highly accurate inspection of semiconductor devices.

Figure 4:
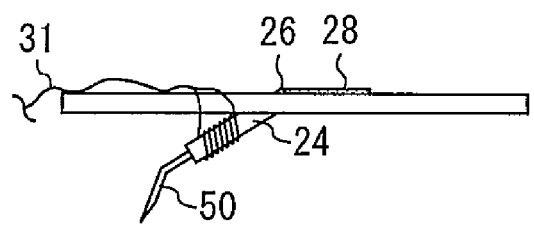
FIG. 4 is a front view of another variation of the inspection apparatus of the first embodiment.

FIG. 4 is a front view of another variation of the inspection apparatus of the first embodiment. This inspection apparatus includes a probe pin 50 which is detachably connected to the socket 24. That is, the probe pin 50 forms the probe tip.

Although in the first embodiment the inspection apparatus 10 has only one probe, it is to be understood that a plurality of probes may be connected to the probe substrate 20. Suitable examples of semiconductor devices to be measured by the inspection apparatus include wafers and chips. However, the inspection apparatus may be used to measure electrical characteristics of any semiconductor device having a pad for contact with the probe. Further, the semiconductor device may be held to the stage 12 by means of suction or electrostatic force. The heating unit 14 may not necessarily be a heating element wire. Other heating means such as heated liquid may be used.

Second Embodiment

Figure 5:
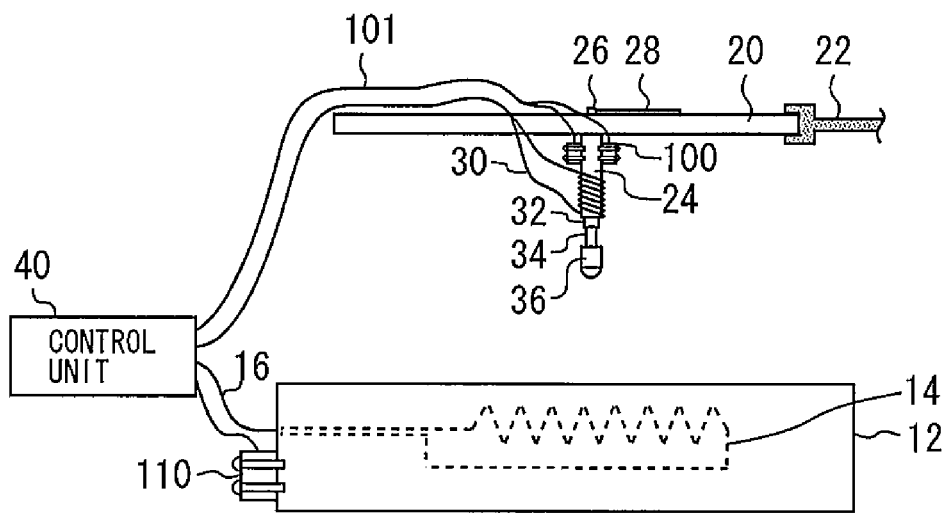
FIG. 5 is a front view of an inspection apparatus in accordance with a second embodiment of the present invention.

FIG. 5 is a front view of an inspection apparatus in accordance with a second embodiment of the present invention. The following description of the second embodiment will be primarily limited to the differences from the first embodiment. A Peltier device 100 is mounted on the socket 24. The current flowing through the Peltier device 100 is supplied from an insulated cable 101.

The stage 12 has formed thereon a cooling unit 110 for cooling the stage 12. The cooling unit 110 is formed of a Peltier device. The control unit 40 controls the currents flowing through the Peltier device 100 and the cooling unit 110 so as to equalize the temperatures of the Peltier device 100 and the stage 12.

Figure 6:
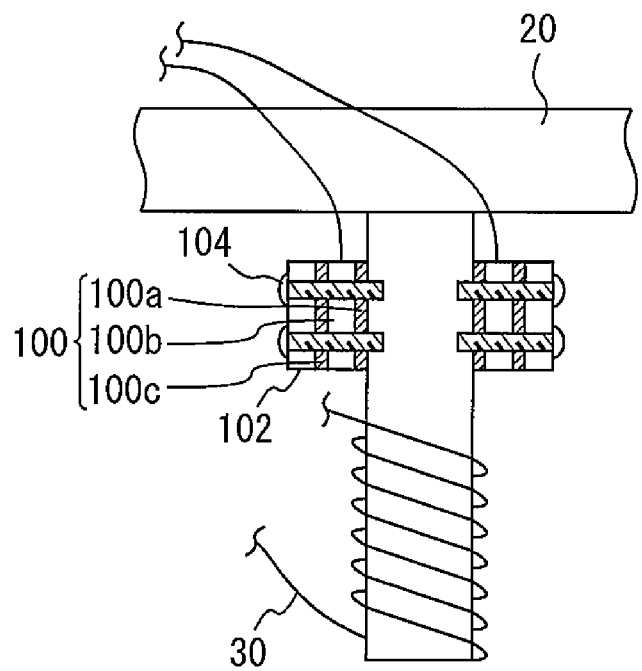
FIG. 6 is an enlarged view of the socket shown in FIG. 5 and its neighboring components.

FIG. 6 is an enlarged view of the socket shown in FIG. 5 and its neighboring components. The Peltier device 100 includes a device portion 100b sandwiched between a metal 100a and a metal 100c. A heat sink 102 is secured to the metal 100c. The Peltier device 100 is secured to the socket 24 by screws 104 which penetrate through the Peltier device 100 and the heat sink 102.

In the inspection apparatus of the second embodiment, the probe tip 36 and the stage 12 can be cooled. Therefore, even when measuring electrical characteristics of a semiconductor device in a cooled state, it is possible to substantially equalize the temperatures of the probe tip 36 and the semiconductor device.

Although in the present embodiment the Peltier device 100 is secured to the socket 24 by the screws 104, it is to be understood that this securing may be accomplished by means of adhesive or solder having good heat dissipation properties. The cooling unit 110 may not necessarily be configured from a Peltier device, but may use, e.g., cooling liquid. Furthermore, the second embodiment is susceptible of alterations at least similar to those that can be made to the first embodiment.

Third Embodiment

Figure 7:
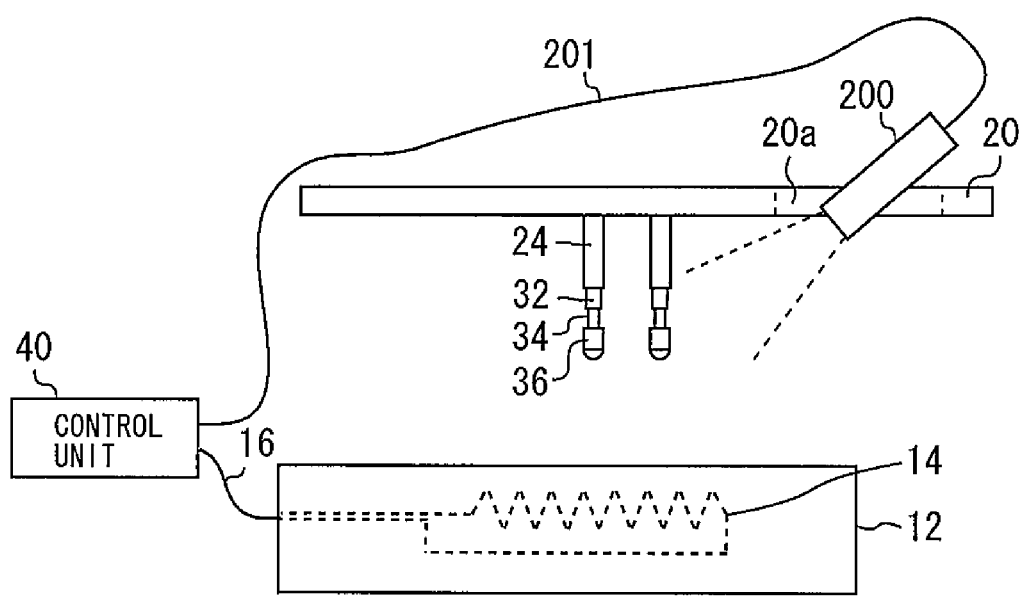
FIG. 7 is a front view of an inspection apparatus in accordance with a third embodiment of the present invention.

FIG. 7 is a front view of an inspection apparatus in accordance with a third embodiment of the present invention. The following description of the third embodiment will be primarily limited to the differences from the first embodiment. Two probes are connected to the probe substrate 20. The probe substrate 20 has an opening 20a formed therein. A halogen heater 200 is mounted in this opening 20a. The halogen heater 200 emits near-infrared radiation. The power to the halogen heater 200 is supplied through a cable 201.

The control unit 40 controls the amounts of heat generated from the halogen heater 200 and the heating unit 14 so as to equalize the temperatures of the probes and the stage 12. The operation of the inspection apparatus of the third embodiment will now be described. First, a semiconductor device is mounted on the stage 12. Next, the stage 12 is heated by the heating unit 14 to thereby heat the semiconductor device while directly illuminating the probe tips 36 of the probes with near-infrared radiation by means of the halogen heater 200 and thereby heating these probes. In this way the temperatures of the probe tips 36 and the semiconductor device are substantially equalized. The probe tips 36 are then brought into contact with the semiconductor device, and the desired electrical measurement is made.

Since in the third embodiment the probes are heated with near-infrared radiation emitted from the halogen heater 200, the filament temperature of the halogen heater 200 may be increased to heat the probes with high power radiation. Further, in the third embodiment, a plurality of probes can be collectively heated. The halogen heater 200 is inexpensive, making it possible to manufacture the inspection apparatus of the third embodiment at low lost.

Figure 8:
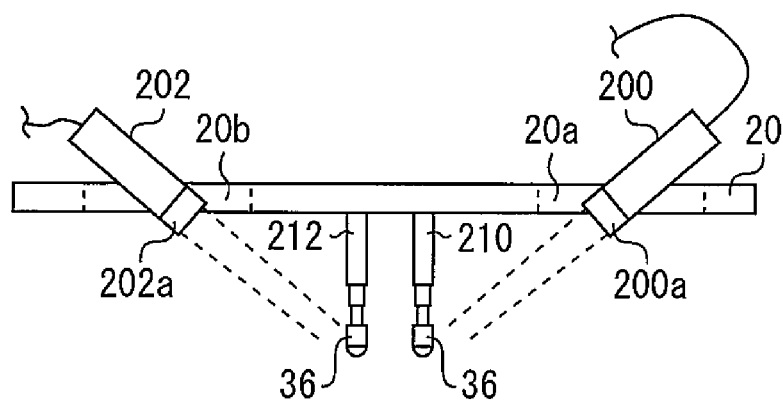
FIG. 8 is a front view of a variation of the inspection apparatus of the third embodiment.

FIG. 8 is a front view of a variation of the inspection apparatus of the third embodiment. In this inspection apparatus, the halogen heater 200 has at its leading end a focusing section 200a for focusing or narrowing the radiation emitted from the halogen heater 200. Another halogen heater 202 in the inspection apparatus also has at its leading end a focusing section 202a for focusing the radiation emitted from the halogen heater 202.

Thus, the halogen heaters 200 and 202 illuminate different probes with near-infrared radiation. The halogen heater 200 selectively or locally heats the probe tip 36 of the probe 210, and the halogen heater 202 selectively or locally heats the probe tip 36 of the probe 212. Thus, the focusing sections 200a and 202a can be used to focus the radiation light onto the probe tips 36 of the probes, making it possible to effectively heat these probe tips.

Figure 9:
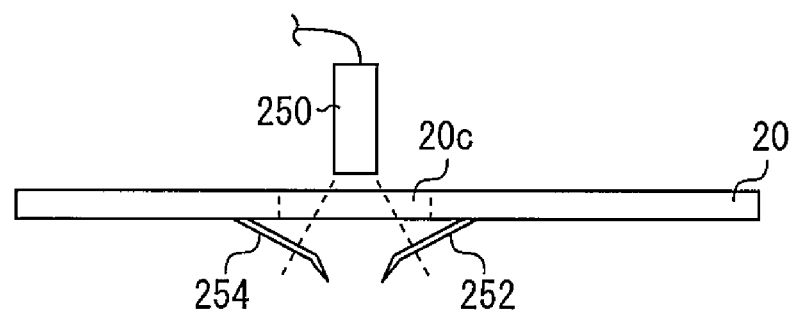
FIG. 9 is a front view of another variation of the inspection apparatus of the third embodiment.

FIG. 9 is a front view of another variation of the inspection apparatus of the third embodiment. The probe substrate 20 has an opening 20c formed therein. A halogen heater 250 is disposed directly above the opening 2c. A plurality of probes, namely, probes 252 and 254, are connected to the probe substrate 20. In this inspection apparatus, the halogen heater 250 illuminates the probes 252 and 254 with near-infrared radiation at once.

In cases where the probes are spaced different distances from a halogen heater, as in the examples of FIGS. 7 and 8, it is not possible to heat the probes to the same temperature by illuminating them with near-infrared radiation emitted from the halogen heater. In order to avoid this problem, the probes 252 and 254 are mounted directly below the opening 20c and heated by the halogen heater 250, which is disposed directly above the opening 20c, as shown in FIG. 9, thereby substantially equalizing the temperatures of the probes 252 and 254. It should be noted that the halogen heater 250 shown in FIG. 9 may be provided with a focusing section at its leading end.

The inspection apparatus of the third embodiment is characterized in that the probes are heated by directly illuminating them with near-infrared radiation. Therefore, a heat source other than a halogen heater may be used. Further, the shape of each probe is not limited to any particular configuration. In addition, the third embodiment is susceptible of alterations at least similar to those that can be made to the first embodiment.

Fourth Embodiment

Figure 10:
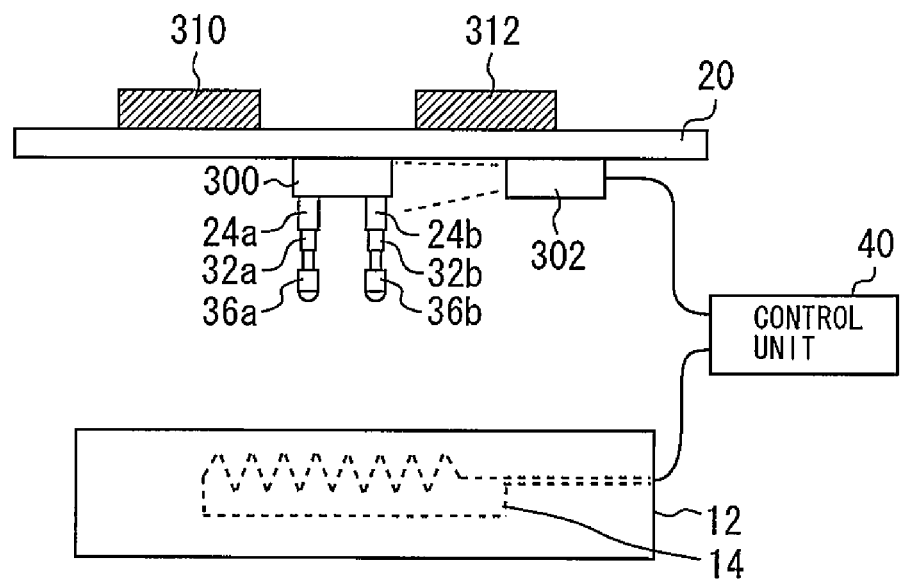
FIG. 10 is a front view of an inspection apparatus in accordance with a fourth embodiment of the present invention.

FIG. 10 is a front view of an inspection apparatus in accordance with a fourth embodiment of the present invention. The following description of the fourth embodiment will be primarily limited to the differences from the first embodiment. A heat absorber 300 of organic material or polymer compound is formed in portions of the probes. The heat absorber 300 may be formed of material including, but not limited to, epoxy resin or polyphenylene sulfide (PPS). Two sockets 24a and 24b are connected to the heat absorber 300.

A ceramic heater 302 for emitting far-infrared radiation is mounted on the bottom surface of the probe substrate 20. The ceramic heater 302 is positioned so as to be able to directly illuminate the heat absorber 300 with far-infrared radiation. The control unit 40 controls the amounts of heat generated from the ceramic heater 302 and the heating unit 14 so as to equalize the temperatures of the probes and the stage 12.

Radiators 310 and 312 for discharging heat from the probe substrate 20 are mounted on the probe substrate 20. The radiators 310 and 312 are preferably blocks of aluminum or copper, which have high heat conductivity. Further, the radiators 310 and 312 may be provided with a fin structure on their top surface. Further, a cooling fan may be provided to circulate air around the radiators 310 and 312.

It is difficult to heat up the probes by means of far-infrared radiation, since they are made of metal. In the inspection apparatus of the fourth embodiment, however, when the heat absorber 300 is illuminated with far-infrared radiation, thermal vibration is induced therein, making it possible to heat up the heat absorber 300 and hence the probe tips 36a and 36b.

A change in the temperature of the probe substrate 20 may cause the substrate to expand or warp. Since expansion or warpage of the probe substrate 20 may result in displacement of the probes, it is desirable to prevent a change in the temperature of the probe substrate 20. In the inspection apparatus of the fourth embodiment, the radiators 310 and 312 provided on the probe substrate 20 serve to discharge heat from the probe substrate 20 to the ambient air. This makes it possible to heat the probes while preventing the expansion or warpage of the probe substrate 20.

Since the two sockets 24a and 24b are connected to the heat absorber 300, these sockets can be heated collectively. It should be noted that three or more sockets maybe connected to the heat absorber, or only one socket may be connected to the heat absorber.

A focusing section for focusing the radiation emitted from the ceramic heater 302 maybe formed at the leading end of the ceramic heater 302. In this case, the ceramic heater 302 can be used to locally heat the heat absorber. It should be noted that the inspection apparatus of the fourth embodiment is susceptible of alterations at least similar to those that can be made to the inspection apparatus of the first embodiment.

Fifth Embodiment

Figure 11:
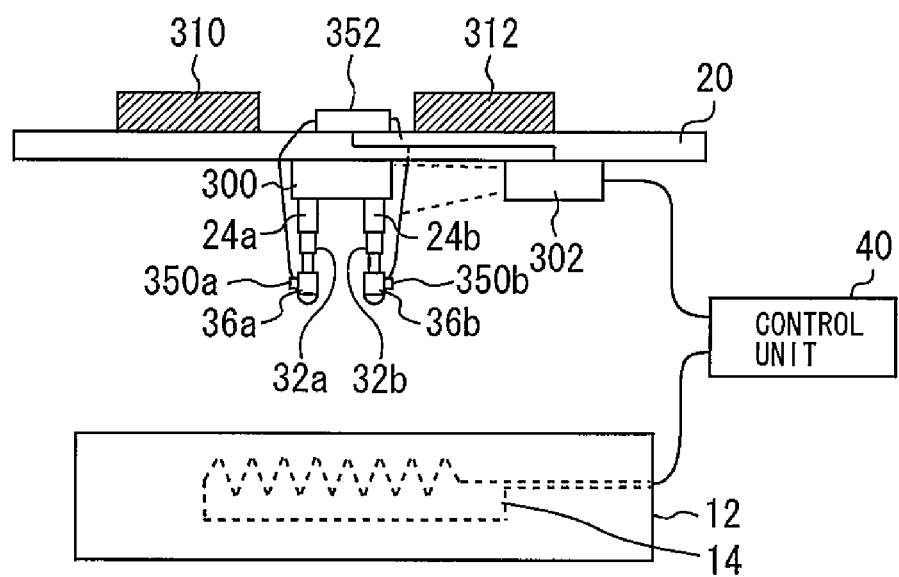
FIG. 11 is a front view of an inspection apparatus in accordance with a fifth embodiment of the present invention.

FIG. 11 is a front view of an inspection apparatus in accordance with a fifth embodiment of the present invention. The following description of the fifth embodiment will be primarily limited to the differences from the fourth embodiment. A temperature sensor 350a is attached to the leading end of one of the two probes provided in the inspection apparatus, and a temperature sensor 350b is attached to the leading end of the other probe. The temperature sensors 350a and 350b may be, but are not limited to, thermocouples or noncontact optical temperature sensors.

The temperature sensors 350a and 350b sense the temperatures of the probe tips 36a and 36b, respectively, and output and transmit signals. The output signals from the temperature sensors 350a and 350b are received by a temperature control unit 352 provided on the probe substrate 20. In response to these signals, the temperature control unit 352 controls the amount of heat generated from the ceramic heater 302 so that the temperatures of the probes are at the desired value.

In the inspection apparatus of the fifth embodiment, the temperatures of the probe tips 36a and 36b are accurately sensed by the temperature sensors 350a and 350b and adjusted to the desired value by controlling the ceramic heater 302 based on the sensed values. This facilitates equalization of the temperatures of the probe tips 36a and 36b and the semiconductor device.

The inspection apparatuses of the third to fifth embodiments are characterized in that the probes are directly heated by means of infrared radiation. Various alterations may be made to these embodiments while retaining this feature. Further, features of the inspection apparatuses of embodiments described above may be combined where appropriate. For example, any of the inspection apparatuses described above may be provided with the radiators 310 and 312 on its probe substrate. It should be noted that the inspection apparatus of the fifth embodiment is susceptible of alterations at least similar to those that can be made to the inspection apparatus of the fourth embodiment.

The present invention makes it possible to vary the temperature of a probe using a simple structure by directly heating the probe.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-101421, filed on Apr. 26, 2012 including specification, claims, drawings and summary, on which the Convention priority of the present application is based, are incorporated herein by reference in its entirety.

What is claimed is:

1. An inspection apparatus comprising:
   a probe substrate;
   a socket secured to said probe substrate;
   a heating element wire wound around said socket;
   a probe tip detachably connected to said socket;
   a stage on which an object to be measured is mounted;
   a heating unit for heating said stage; and
   a control unit for controlling the amounts of heat generated from said heating element wire and said heating unit so as to substantially equalize the temperatures of said probe tip and said stage.

2. The inspection apparatus according to claim 1, further comprising a plug detachably connected to said socket, wherein said probe tip is connected to said plug.

3. The inspection apparatus according to claim 1, wherein said probe tip is formed of a probe pin.

4. The inspection apparatus according to claim 1, further comprising:
   a Peltier device attached to said socket; and
   a cooling unit for cooling said stage.

5. The inspection apparatus according to claim 4, wherein said control unit controls said Peltier device and said cooling unit so as to substantially equalize the temperatures of said Peltier device and said stage.

6. The inspection apparatus according to claim 1, further comprising a radiator formed on said probe substrate so as to discharge heat from said probe substrate.

7. An inspection apparatus comprising;
   a probe substrate;
   a probe connected to said probe substrate;
   a heater for heating said probe by directly illuminating said probe with infrared radiation;
   a stage on which an object to be measured is mounted;
   a heating unit for heating said stage; and
   a control unit for controlling the amounts of heat generated from said heater and said heating unit so as to substantially equalize the temperatures of said probe and said stage.

8. The inspection apparatus according, to claim 7, wherein said heater emits near-infrared radiation.

9. The inspection apparatus according to claim 8, wherein said heater is a halogen heater.

10. The inspection apparatus according to claim 7, wherein:
    said heater has at a leading end thereof a focusing section for focusing or narrowing said radiation emitted from said heater; and said heater locally heats said probe.

11. The inspection apparatus according to claim 7, wherein:
    said probe has in a portion thereof a heat absorber formed of organic material or polymer compound;
    said heater directly illuminates said heat absorber with far-infrared radiation; and
    said probe is made of metal.

12. The inspection apparatus according to claim 11, wherein said heater is a ceramic heater.

13. The inspection apparatus according to claim 11, wherein:
    said heater has at a leading end thereof a focusing section for focusing or narrowing said radiation emitted from said heater; and
    said heater locally heats said heat absorber.

14. The inspection apparatus according to claim 7, further comprising a control unit for controlling the amounts of heat generated from said heater and said heating unit so as to equalize the temperatures of said probe and said stage.

15. The inspection apparatus according to claim 7, further comprising:
    a temperature sensor attached to said probe; and
    a temperature control unit which receives an output signal from said temperature sensor; wherein said temperature control unit adjusts the amount of heat generated from said heater so that the temperature of said probe is at the desired value.

* * * * *